United States Patent
Honda et al.

(10) Patent No.: US 12,108,617 B2
(45) Date of Patent: Oct. 1, 2024

(54) LIGHT-EMITTING ELEMENT, LIGHT-EMITTING DEVICE, AND METHOD FOR MANUFACTURING LIGHT-EMITTING ELEMENT

(71) Applicant: SHARP KABUSHIKI KAISHA, Sakai (JP)

(72) Inventors: Daisuke Honda, Sakai (JP); Yoshihiro Ueta, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 414 days.

(21) Appl. No.: 17/640,127

(22) PCT Filed: Sep. 4, 2019

(86) PCT No.: PCT/JP2019/034863
§ 371 (c)(1),
(2) Date: Mar. 3, 2022

(87) PCT Pub. No.: WO2021/044558
PCT Pub. Date: Mar. 11, 2021

(65) Prior Publication Data
US 2022/0310960 A1    Sep. 29, 2022

(51) Int. Cl.
*H10K 50/125* (2023.01)
*H10K 50/15* (2023.01)
*H10K 50/16* (2023.01)
*H10K 71/00* (2023.01)
*H10K 102/00* (2023.01)

(52) U.S. Cl.
CPC .......... *H10K 50/125* (2023.02); *H10K 50/15* (2023.02); *H10K 50/16* (2023.02); *H10K 71/00* (2023.02); *H10K 2102/331* (2023.02)

(58) Field of Classification Search
CPC ...... H10K 50/125; H10K 50/15; H10K 50/16; H10K 71/00; H10K 2102/331; H10K 71/40; H10K 2101/80; H10K 2102/351; H10K 59/35; H10K 50/115; H05B 33/10; H05B 33/14
See application file for complete search history.

(56) References Cited

U.S. PATENT DOCUMENTS

| | | | |
|---|---|---|---|
| 2010/0108984 | A1 | 5/2010 | Cho et al. |
| 2016/0233449 | A1 | 8/2016 | Murayama et al. |
| 2020/0083469 | A1 | 3/2020 | Lhuillier |

FOREIGN PATENT DOCUMENTS

| | | | |
|---|---|---|---|
| CN | 105684555 A | | 6/2016 |
| CN | 108137323 A | | 6/2018 |
| CN | 110885674 A | * | 9/2018 |
| JP | 2010-114079 A | | 5/2010 |

\* cited by examiner

*Primary Examiner* — William B Partridge
*Assistant Examiner* — Sesha Sairaman Srinivasan
(74) *Attorney, Agent, or Firm* — ScienBiziP, P.C.

(57) ABSTRACT

A light-emitting layer of a light-emitting element contains halogen ligands and organic ligands coordinated to each of quantum dots. The light-emitting layer includes: a first region toward a hole-transport layer; and a second region toward an electron-transport layer. In the first region, a concentration of the halogen ligands is higher than a concentration of the organic ligands, and, in the second region, the concentration of the halogen ligands is lower than the concentration of the organic ligands.

20 Claims, 12 Drawing Sheets

(a)

(b)

(a)

(b)

(c)

LIGHT-EMITTING ELEMENT, LIGHT-EMITTING DEVICE, AND METHOD FOR MANUFACTURING LIGHT-EMITTING ELEMENT

TECHNICAL FIELD

The disclosure relates to a light-emitting element containing quantum dots, and a light-emitting device including the light-emitting element.

BACKGROUND ART

Patent Document 1 discloses a light-emitting element including a light-emitting layer containing quantum dots. To a surface of each quantum dot, ligands are coordinated.

CITATION LIST

Patent Literature

[Patent Document 1] Japanese Unexamined Patent Application Publication No. 2010-114079

SUMMARY

Technical Problem

In a known light-emitting element disclosed in Patent Document 1, the electrons and the holes exhibit different injection efficiency when injected into the light-emitting layer. As a result, the electrons are injected excessively into the light-emitting layer, decreasing external quantum efficiency of the light-emitting element.

Solution to Problem

In order to solve the above problem, a light-emitting element according to an aspect of the disclosure includes: a cathode; an anode; a light-emitting layer provided between the cathode and the anode and containing quantum dots; an electron-transport layer provided between the light-emitting layer and the cathode; and a hole-transport layer provided between the light-emitting layer and the anode. The light-emitting layer contains halogen ligands and organic ligands coordinated to each of the quantum dots. The light-emitting layer includes: a first region toward the hole-transport layer; and a second region toward the electron-transport layer. In the first region, a concentration of the halogen ligands is higher than a concentration of the organic ligands, and, in the second region, the concentration of the halogen ligands is lower than the concentration of the organic ligands.

Moreover, in order to solve the above problem, a method is directed to manufacturing of a light-emitting element including: a cathode; an anode; a light-emitting layer provided between the cathode and the anode and containing quantum dots; an electron-transport layer provided between the light-emitting layer and the cathode; and a hole-transport layer provided between the light-emitting layer and the anode. The method includes forming the light-emitting layer above the electron-transport layer. The forming of the light-emitting layer includes: stacking the light-emitting layer above the electron-transport layer, the light-emitting layer containing the quantum dots having organic ligands; impregnating a surface of the light-emitting layer with a halogen agent toward the electron-transport layer; and heating the light-emitting layer after the impregnating.

Advantageous Effect of Invention

An aspect of the disclosure can provide a light-emitting element whose light-emitting layer reduces excessive electrons and increases external quantum efficiency.

DESCRIPTION OF EMBODIMENTS

First Embodiment

Figure 1:
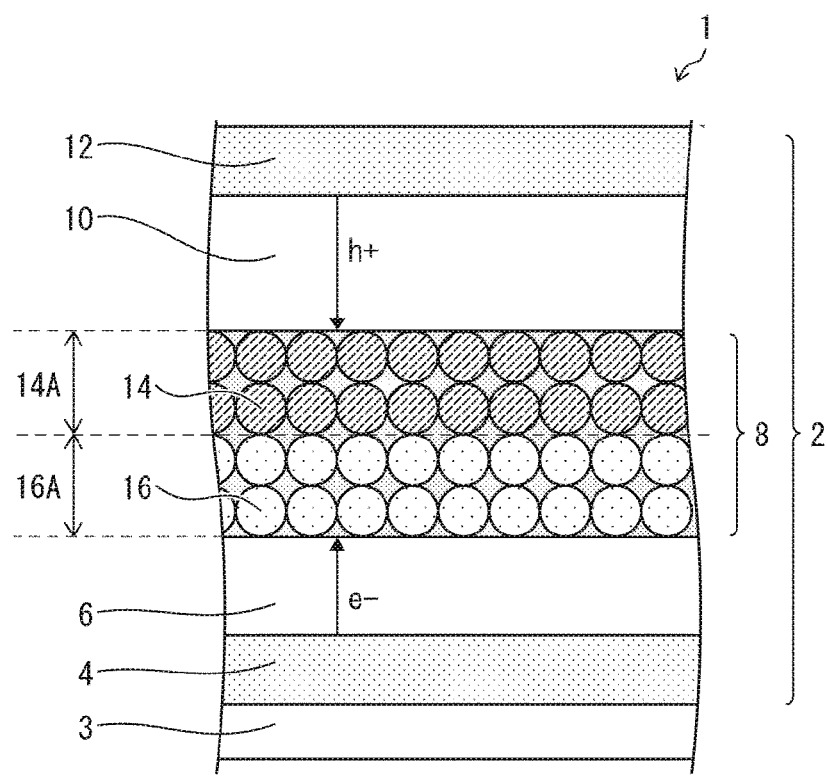
FIG. 1 is a schematic cross-sectional view of a light-emitting device according to a first embodiment of the disclosure.

FIG. 1 is a schematic cross-sectional view of a light-emitting device 1 according to this embodiment. FIG. 1 shows that the light-emitting device 1 according to this embodiment includes: a light-emitting element 2; and an array substrate 3. The light-emitting device 1 is structured to include the light-emitting element 2 multilayered and stacked on the array substrate 3 formed of not-shown thin-film transistors (TFTs). Note that, in DESCRIPTION, a direction from the light-emitting element 2 in the light-emitting device 1 toward the array substrate 3 is referred to as a "downward direction", and a direction from the array substrate 3 toward the light-emitting element 2 in the light-emitting device 1 is referred to as an "upward direction".

The light-emitting element 2 includes: a cathode 4; an electron-transport layer 6; a light-emitting layer 8; a hole-transport layer 10; and an anode 12, all of which are stacked on top of another in the stated order from below. The cathode 4, which is included in the light-emitting element 2 formed above the array substrate 3, is electrically connected to the TFTs of the array substrate 3. For a light-emitting element according to another embodiment, a cathode may be provided above an array substrate. Such a light-emitting element may include: the cathode; an electron-transport layer; a light-emitting layer; a hole-transport layer; and an anode on top of another in the stated order.

Described in detail below are the layers of the light-emitting element 2.

The cathode 4 and the anode 12, containing a conductive material, are respectively and electrically connected to the electron-transport layer 6 and the hole-transport layer 10.

Either the cathode 4 or the anode 12 is a transparent electrode. The transparent electrode may be made of, for example, ITO, IZO, ZnO, AZO, BZO, or FTO, and deposited by, for example, sputtering. Moreover, either the cathode 4 or the anode 12 may contain a metallic material. The metallic material preferably includes such a substance as Al, Cu, Au, Ag, or Mg which is high in reflectance of visible light. The metallic material preferably includes either such a substance alone, or an alloy of the substances.

The electron-transport layer 6 transports electrons from the cathode 4 to the light-emitting layer 8. Other than $TiO_2$, the electron-transport layer 6 can be made of an organic material or an inorganic material used for light-emitting elements containing quantum dots or for organic EL light-emitting elements as known. The organic material of the electron-transport layer 6 may be a conductive compound such as Alq3, BCP, or t-Bu-PBD. The inorganic material of the electron-transport layer 6 may be a metallic oxide such as ZnO, ZAO, ITO, IGZO, or an electride. In particular, the material of the hole-transport layer 6 is preferably low in electron affinity.

The hole-transport layer 10 transports holes from the anode 12 to the light-emitting layer 8. The hole-transport layer 10 can be made of an organic material or an inorganic material used for light-emitting elements containing quantum dots or for organic EL light-emitting elements as known. The organic material of the hole-transport layer 10 may be a conductive compound such as CBP, PPV, PEDOT-PSS, TFB, or PVK. The inorganic material of the hole-transport layer 10 may be a metallic oxide such as molybdenum oxide, NiO, $Cr_2O_3$, MgO, MgZnO, $LaNiO_3$, or $WO_3$. In particular, the material of the hole-injection layer 10 is preferably high in electron affinity and ionization potential.

In this embodiment, the electron-transport layer 6 and the hole-transport layer 10 are made of the above materials and formed by such techniques as vapor deposition, sputtering, or application of colloidal solution. Moreover, the light-emitting element 2 may include: an electron-injection layer between the cathode 4 and the electron-transport layer 6; and a hole-injection layer between the anode 12 and the hole-transport layer 10. Furthermore, the light-emitting element 2 may include an intermediate layer either between the electron-transport layer 6 and the light-emitting layer 8, or between the hole-transport layer 10 and the light-emitting layer 8. Any of the electron-injection layer, the hole-injection layer, and the intermediate layer may be formed by the same technique as the electron-transport layer 6 or the hole-transport layer 10 is formed.

The light-emitting layer 8 is a quantum dot layer including multilayered quantum dots (semiconductor nano particles). In this embodiment, the light-emitting layer 8 includes: a first region 14A toward the hole-transport layer 10; and a second region 16A toward the electron-transport layer 6. In the light-emitting layer 8, the first region 14A includes first quantum dots 14, and the second region 16A includes second quantum dots 16.

As illustrated in FIG. 1, the first quantum dots 14 and the second quantum dots 16 in the light-emitting layer 8 do not have to be arranged with regularity. The first quantum dots 14 and the second quantum dots 16 may be included at random in the light-emitting layer 8. Note that the light-emitting layer 8 preferably has a thickness ranging from 2 to 100 nm.

Figure 2:
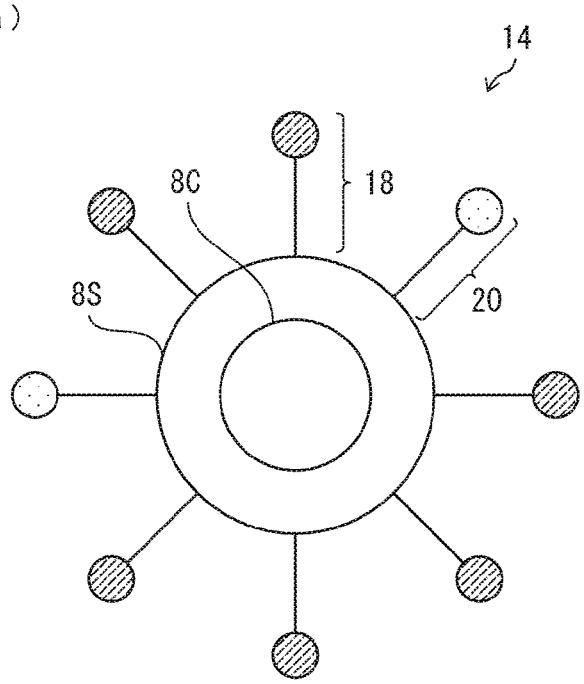
FIG. 2 is an enlarged schematic view of quantum dots according to the first embodiment of the disclosure.
Figure 2:
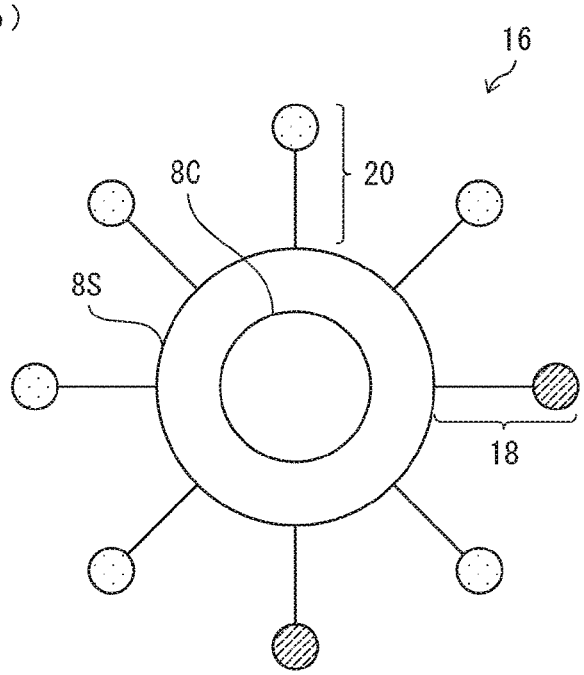

Described below with reference to FIG. 2 are a first quantum dot 14 and a second quantum dot 16 included in the light-emitting layer 8 according to this embodiment. FIG. 2(a) illustrates a schematic cross-sectional view of the first quantum dot 14. FIG. 2(b) illustrates a schematic cross-sectional view of the second quantum dot 16.

Both the first quantum dot 14 and the second quantum dot 16 are core/shell quantum dots each including: a core 8C; and a shell 8S formed around the core 8C. In view of efficient injection of carriers from outside the shell 8S into the core 8C in this embodiment, the shell 8S is wider in bandgap than the core 8C. The shell 8S is capable of reducing, for example, flaws or dangling bond of the core 8C, and of curbing recombination of carriers undergoing deactivation.

Each of the first quantum dot 14 and the second quantum dot 16 may be a semi-cadmium-based conductive nano particle including: the core 8C made of CdSe; and the shell 8S made of ZnS. Other than that, the first quantum dot 14 and the second quantum dot 16 may also include CdSe/CdS, InP/ZnS, ZnSe/ZnS, or GIGS/ZnS in the form of a core/shell structure. Note that the shell 8S may formed of a plurality of layers made of different materials.

Each of the first quantum dot 14 and the second quantum dot 16, including a valence band level and a conduction band level, is a light-emitting material emitting light by recombination of holes in the valence band level and electrons in the conduction band level. The light emitted from the first quantum dot 14 and the second quantum dot 16 has a narrow spectrum because of the quantum confinement effect. Hence, the emitted light can be relatively high in chromaticity.

Each of the first quantum dot 14 and the second quantum dot 16 has a particle size ranging approximately from 2 to 15 nm. A wavelength of the light emitted from the first quantum dot 14 and the second quantum dot 16 can be controlled with the particle size of the first quantum dot 14 and the second quantum dot 16. In particular, the first quantum dot 14 and the second quantum dot 16 have a core/shell structure. Thus, when the particle size of the core 8C of each quantum dot is controlled, the wavelength of the light emitted from the quantum dot can be controlled. Hence, when the particle size of the core 8C of each of the first quantum dot 14 and the second quantum dot 16 is controlled, the wavelength of the light emitted from the light-emitting device 1 can be controlled.

As illustrated in FIG. 2(a) and FIG. 2(b), each of the first quantum dot 14 and the second quantum dot 16 has halogen ligands 18 and organic ligands 20 coordinated to the shell 8S.

The halogen ligands 18 are made of halogens coordinated directly to the shell 8S. The halogens are electrically conductive and electron-attracting. The halogens included in the halogen ligands 18 are preferably any one of F, Cl, Br, or I. The halogens included in the halogen ligands 18 may be the same or different from one another.

The organic ligands 20 may contain organic substances commonly used as ligands of quantum dots. The organic ligands 20 include, for example, organic long chains of hydrocarbons combined together, and modified functional groups positioned at one end to the organic long chains and coordinated to the shell 8S. The modified functional groups contain, for example, an amino group or a thiol group. The organic ligands 20 are capable of reducing, for example, flaws or dangling bond of the shell 8S. Other than that, the organic ligands 20 achieve such advantageous effects as: reducing aggregation of the quantum dots to which the organic ligands 20 are coordinated; protecting the quantum dots from the surrounding environment; providing electrical stability to the surface of the quantum dots; or facilitating dissolution or dispersion of the quantum dots into a solvent.

Here, a proportion of the halogen ligands 18 to all the ligands included in the first quantum dot 14 is higher than a proportion of the halogen ligands 18 to all the ligands included in the second quantum dot 16. For example, the first quantum dot 14 may be higher in content of the halogen ligands 18 than the second quantum dot 16.

Furthermore, a proportion of the organic ligands 20 to all the ligands included in the second quantum dot 16 is higher than a proportion of the organic ligands 20 to all the ligands included in the first quantum dot 14. For example, the second quantum dot 16 may be higher in content of the organic ligands 20 than the first quantum dot 14.

Hence, in the first region 14A, a concentration of the halogen ligands 18 is higher than a concentration of the organic ligands 20. In the second region 16A, the concentration of the halogen ligands 18 is lower than the concentration of the organic ligands 20. Here, the concentration of the halogen ligands 18 in the first region 14A or in the second region 16A is the sum of the concentration of the halogen ligands 18 coordinated to the first quantum dots 14 or to the second quantum dots 16 and the concentration of the halogen ligands 18 coordinated neither to the first quantum dots 14 nor to the second quantum dots 16.

Note that the halogen ligands 18 in the first region 14A may be larger in quantity than the halogen ligands 18 in the second region 16A. Moreover, the organic ligands 20 in the first region 14A may be smaller in quantity than the halogen ligands 20 in the second region 16A. Furthermore, the halogen ligands 18 in the first region 14A are higher in concentration than the halogen ligands 18 in the second region 16A. In addition, the organic ligands 20 in the first region 14A may be lower in concentration than the halogen ligands 20 in the second region 16A.

The concentrations of the halogen ligands 18 and the organic ligands 20 included in the first region 14A and the second region 16A of the light-emitting layer 8 can be observed of a cross-section cut out of the light-emitting layer 8 in the stacking direction of the light-emitting element 2. The concentrations can be obtained by, for example, the X-ray photoelectron spectroscopy (XPS) or the transmission electron microscopy-energy dispersive X-ray spectroscopy (TEM-EDS).

Figure 3:
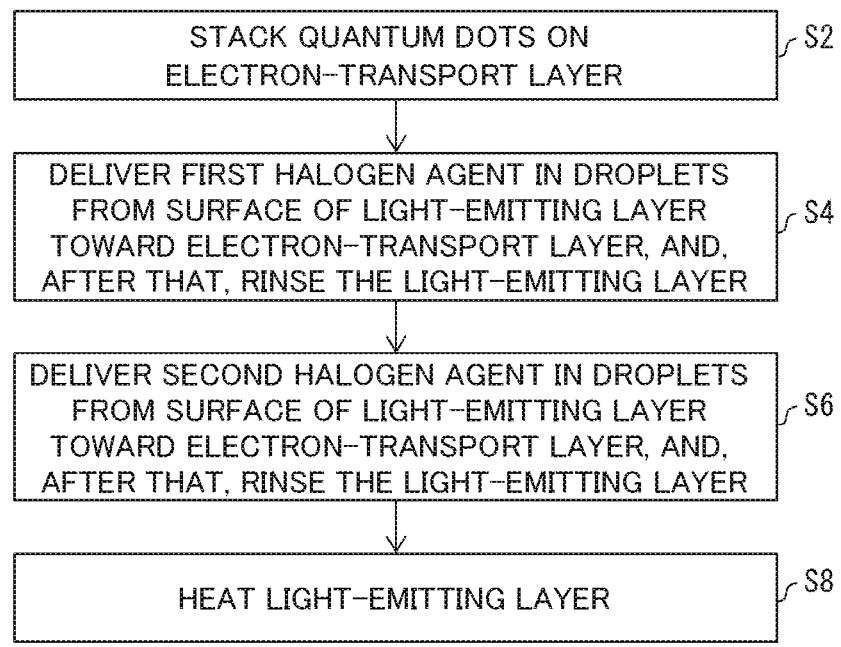
FIG. 3 is a flowchart to describe how to form a light-emitting layer according to the first embodiment of the disclosure.
Figure 4:
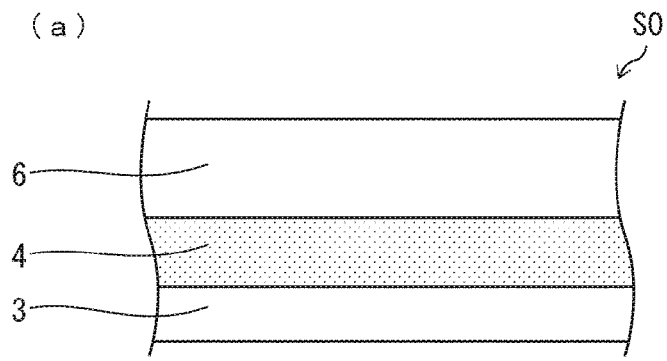
FIG. 4 shows cross-sectional views of a set of steps, illustrating how to form the light-emitting layer according to the first embodiment of the disclosure.
Figure 4:
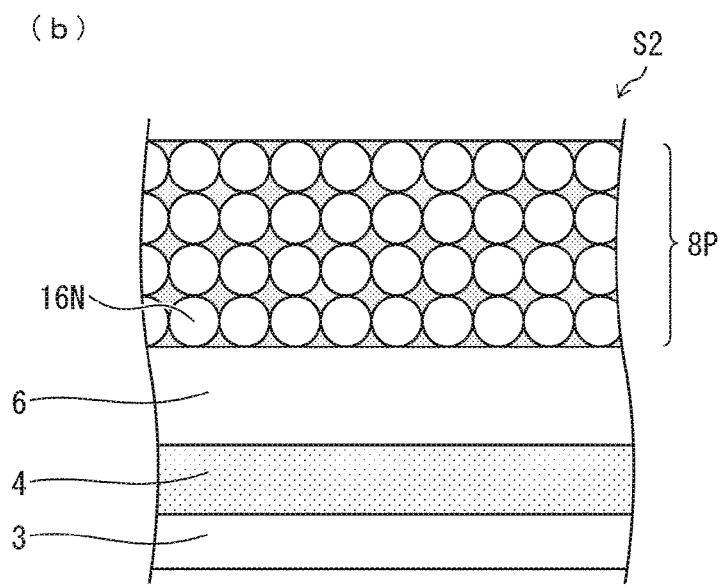
Figure 4:
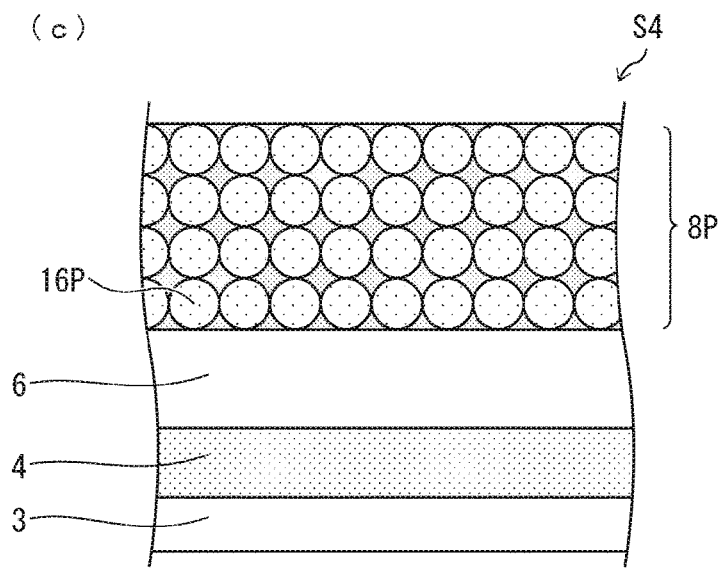
Figure 5:
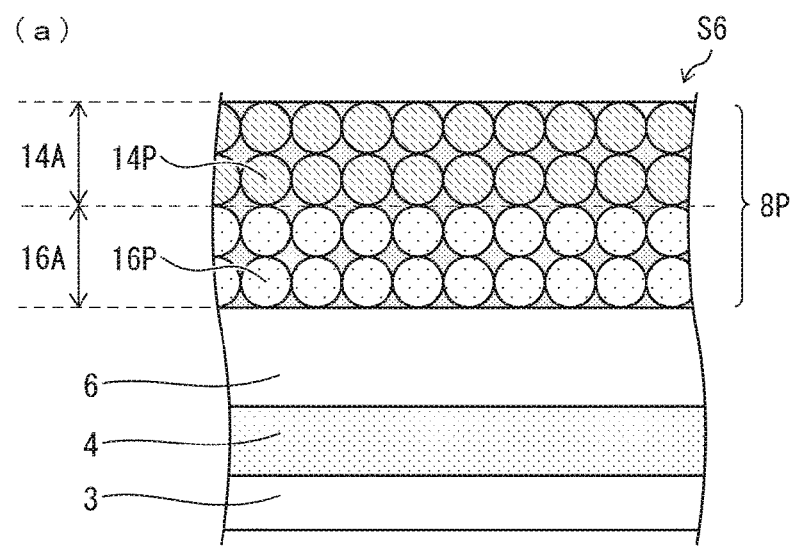
FIG. 5 shows cross-sectional views of another set of steps, illustrating how to form the light-emitting layer according to the first embodiment of the disclosure.
Figure 5:
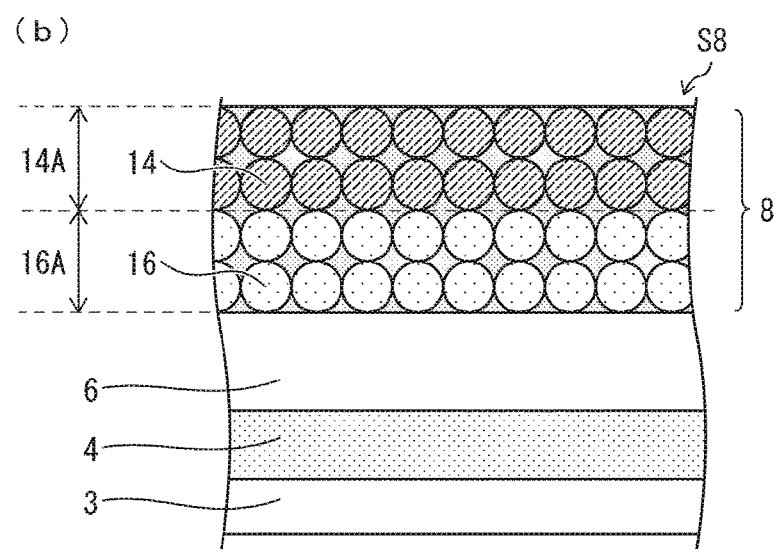
Figure 6:
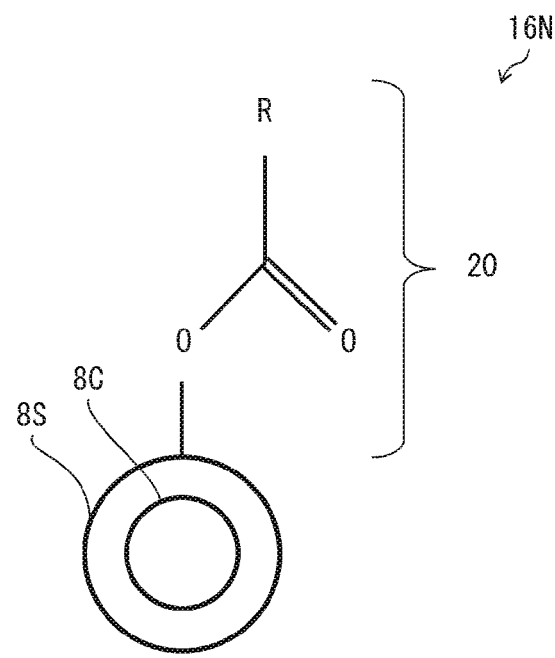
FIG. 6 is a schematic enlarged view for illustrating halogenation of a ligand of a quantum dot according to the first embodiment of the disclosure.
Figure 6:
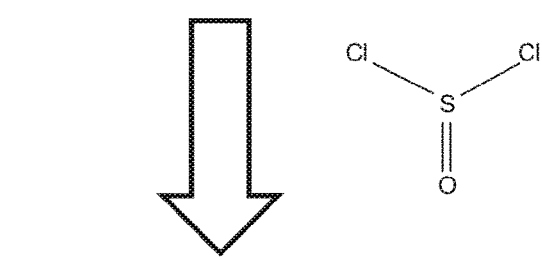
Figure 6:
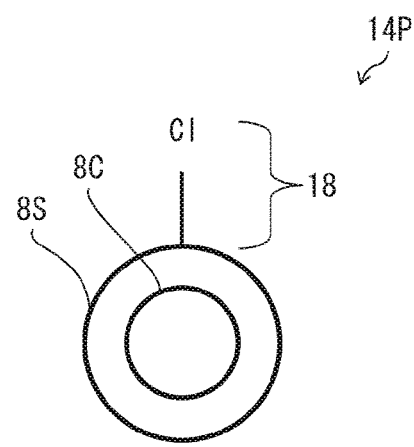

Described below in detail is how to form the light-emitting layer 8 according to this embodiment, with reference to FIGS. 3 to 6. FIG. 3 is a flowchart to describe how to form the light-emitting layer 8 according to this embodiment. FIGS. 4 and 5 show cross-sectional views of a set of steps, illustrating how to form the light-emitting layer 8 according to this embodiment. The cross-sections in FIGS. 4 and 5 correspond in position to the cross-section in FIG. 1. FIG. 6 is a schematic view for illustrating how to prepare a first quantum dot 14 from a second quantum dot 16 according to this embodiment.

In this embodiment, as illustrated in FIG. 4(a), the array substrate 3, the cathode 4, and the electron-transport layer 6 are formed prior to the light-emitting layer 8. In forming the light-emitting layer 8, first, as illustrated in FIG. 4(b), organic-ligand quantum dots 16N without the halogen ligands 18 are multilayered to form a light-emitting layer 8P before halogenated (Step S2).

The organic-ligand quantum dots 16N may be quantum dots having a core/shell structure. To the organic-ligand quantum dots 16N, only organic ligands may be coordinated. Specifically, as illustrated in FIG. 6, each of the organic-ligand quantum dots 16N may include the same core 8C and the same shell 8S as those of the second quantum dot 16. To each organic-ligand quantum dot 16N, only the organic ligands 20 may be coordinated.

For example, each of the organic ligands 20 included in the organic-ligand quantum dot 16N may be oleic acid illustrated in FIG. 6. Here, "R" in FIG. 6 indicates an aliphatic hydrocarbon group. It is preferable for the organic ligand quantum dot 16N to include the organic ligands 20 containing oleic acid, in view of uniform dispersion and formation of quantum dots, included in the light-emitting layer 8, on the electron-transport layer 6.

Next, a first halogen agent is delivered in droplets from a surface of the light-emitting layer 8P before halogenated toward the electron-transport layer 6. Hence, the first halogen agent impregnates the organic ligand quantum dots 16N. After that, the light-emitting layer 8P is sufficiently rinsed with, for example, toluene (Step S4). From an outermost surface of the light-emitting layer 8P before halogenated toward the electron-transport layer 6, the first halogen agent impregnates substantially all of the light-emitting layer 8P before halogenated.

Here, the first halogen agent may contain thionyl chloride illustrated in FIG. 6. In such a case, the first halogen agent specifically contains thionyl chloride whose molecules are fewer than $10^4$ per organic ligand quantum dot 16N. When the first halogen agent impregnates the organic ligand quantum dots 16N, the organic ligands 20 coordinated to the organic ligand quantum dots 16N partially remain. Hence, at Step S4 illustrated in FIG. 4(c), the light-emitting layer 8P is formed, containing pre-heated second quantum dots 16P.

The second quantum dots 16P may be formed of the organic ligand quantum dots 16N to which halogen elements derived from the halogen agent are directly coordinated as the halogen ligands 18. Alternatively, the second quantum dots 16P may be formed of the organic ligand quantum dots 16N whose organic ligands 20 are replaced with halogen elements derived from the halogen agent and serving as the halogen ligands 18.

After Step S4, a second halogen agent, which is higher in thionyl chloride concentration than the first halogen agent, is delivered in droplets from the surface of the light-emitting layer 8P toward the electron-transport layer 6. Hence, the second halogen agent impregnates the second quantum dots 16P. After that, the light-emitting layer 8P is sufficiently rinsed with, for example, toluene (Step S6). The second halogen agent specifically contains thionyl chloride whose molecules are $10^4$ or more and $10^6$ or fewer per second quantum dot 16P.

When the second halogen agent impregnates the second quantum dots 16P, almost all of the organic ligands 20 coordinated to the second quantum dots 16P are replaced with the halogen ligands 18. Moreover, when the second halogen agent impregnates the light-emitting layer 8P at Step S6, the time period for the impregnation is controlled to form the first region 14A that the second halogen agent impregnates and the second region 16A that the second halogen agent does not impregnate.

Hence, at Step S6 illustrated in FIG. 5(a), the first region 14A is formed in the light-emitting layer 8P. The first region 14A is impregnated with the second halogen agent, and contains pre-heated first quantum dots 14P. Moreover, the second region 16A is formed in a region including the second quantum dots 16P and not impregnated with the second halogen agent.

In view of efficiently replacing the organic ligands 20 of the second quantum dots 16P with the halogen ligands 18 and forming the first quantum dots 14P, the concentration of thionyl chloride in the second halogen agent is preferably $10^4$ or higher, and more preferably, $10^5$ or higher. Furthermore, the concentration of thionyl chloride in the second halogen agent is preferably $10^6$ or lower. Such features make it possible to curb generation of hydrogen halide (e.g. hydrogen chloride) derived from the second halogen agent in the droplets of the second halogen agent, and to reduce flaws of the second quantum dots 16 caused by the generated hydrogen halide.

Here, a time period for the impregnation of the second halogen agent is shorter than that of the first halogen agent. Depending on the film thickness of the light-emitting layer 8P or the amount of the second quantum dots 16 filled in the light-emitting layer 8P, the time period for the impregnation of the second halogen agent preferably ranges from one second to sixty seconds.

The halogen agents according to this embodiment, including the first halogen agent and the second halogen agent, are appropriately selected preferably in view of protecting the shells of the second quantum dots 16. Of the halogen agents, an example of a substitute for thionyl chloride as a chloride agent includes phosphorus trichloride, phosphorus pentachloride, oxalyl chloride, methoxyacetyl chloride, cyanuric chloride, tetrabutylammonium chloride, or propyltrichlorosilane.

In such a case, Cl is coordinated as the halogen ligands 18 to the quantum dots.

Next, the light-emitting layer 8P is heated at a temperature at which the ligands remain unseparated from the quantum dots (Step S8). The heating temperature at Step S8 may be, for example, approximately 120° C., so that the organic ligands 20 containing oleic acid and the halogen ligands 18 containing chlorine remain unseparated from the quantum dots. At Step S8, as illustrated in FIG. 5(b), the light-emitting layer 8 is formed to include the first region 14A containing the first quantum dots 14 and the second region 16A containing the second quantum dots 16.

In this embodiment, the halogen ligands 18 of the first quantum dots 14 include, but not limited to, Cl in the forming of the light-emitting layer 8. At Steps S4 and S6, the chloride agent may be replaced with a fluorinating agent, a bromiding agent, and an iodizing agent as the halogen agent. Hence, instead of CL, halogen elements of F, Br, and I are coordinated as the halogen ligands 18 to the second quantum dots 16. For example, the second quantum dots 16 may be bromided. In such a case, the halogen agent may contain tetrabutylammonium bromide. Other than that, for example, at Steps S4 and S6, the second quantum dots 16 may be iodized. In such a case, the halogen agent may contain tetrabutylammonium iodide.

In the light-emitting element 2 according to this embodiment, the light-emitting layer 8 includes a plurality of quantum dots containing the halogen ligands 18. The concentration of the halogen ligands 18 is higher in the first region 14A toward the hole-transport layer 10 than in the second region 16A toward the electron-transport layer 6.

The halogen ligands 18 are electrically conductive, and, in this embodiment, mobility of charges in the light-emitting layer 8 increases. The concentration of the halogen ligands 18 is higher in the first region 14A than in the second region 16A. Hence, the increase in the mobility of charges caused by the halogen ligands 18 is more apparent to the holes injected into the light-emitting layer 8 than to the electrons injected into the light-emitting layer 8.

Here, light-emitting elements were actually produced in order to evaluate a difference between the mobility of the holes and the mobility of the electrons in the light-emitting layer 8. First, a plurality of light-emitting elements were produced. Each light-emitting element included the cathode 4 made of ITO, the electron-transport layer 6 made of ZnO, the hole-transport layer 10 made of CBP, the hole-injection layer made of molybdenum oxide, and the anode 12 made of Al.

The first quantum dots 14 and the second quantum dots 16, included in the light-emitting layer 8, were core/shell quantum dots of CdSe/ZnS/ZnS. Each of the first quantum dots 14 and the second quantum dots 16 had a core diameter of 6 nm and a shell thickness of 3 nm. Hence, the first quantum dot 14 and the second quantum dot 16 had a diameter of 12 nm.

Moreover, in one of the produced light-emitting elements, the light-emitting layer 8 included multilayered quantum dots having the organic ligands 20 alone. In another one of the produced light-emitting elements, the light-emitting layer 8 included multilayered quantum dots having the halogen ligands 18 alone. In still another one of the produced light-emitting elements, the light-emitting layer 8 included multilayered first quantum dots 14 in the first region 14A and multilayered second quantum dots 16 in the second region 16A, as seen in the light-emitting element 2 according to this embodiment.

A current density and a voltage characteristic of the above light-emitting elements were actually measured. From the data obtained by the accrual measurements, mobility of the electrons and mobility of the holes were calculated, using the space charge limited current (SCLC) model.

In the light-emitting element including the light-emitting layer 8 containing the multilayered quantum dots having the organic ligands 20 alone, the mobility of the electrons in the light-emitting layer 8 was 55 times as high as the mobility of the holes. In the light-emitting element including the light-emitting layer 8 containing the multilayered quantum dots having the halogen ligands 18 alone, the mobility of the electrons in the light-emitting layer 8 was 24 times as high as the mobility of the holes. Moreover, in the light-emitting element including the light-emitting layer 8 containing the multilayered first quantum dots 14 in the first region 14A and the multilayered second quantum dots 16 in the second region 16A, the mobility of the electrons in the light-emitting layer 8 was 7.3 times as high as the mobility of the holes.

From the above results, the mobility of the carriers in the light-emitting layer 8 of the light-emitting element 2 according to this embodiment is lower than the mobility of the carries in the light-emitting layer 8 of the light-emitting element containing the multilayered quantum dots having either the organic ligands 20 alone or the halogen ligands 18 alone. Hence, in the light-emitting element 2 according to this embodiment, the mobility of the holes in relation to the mobility of the electrons improves in the light-emitting layer 8. Such a feature reduces excessive electrons in the light-emitting layer 8.

Moreover, the halogen ligands 18 are electron-attracting. That is why the valence band level of the light-emitting layer 8 varies, and the hole injection barrier lowers when the holes are injected from the hole-transport layer 10 into the light-emitting layer 8. Such a feature increases efficiency in injection of the holes from toward the hole-transport layer 10 into the light-emitting layer 8, and reduces excessive electrons in the light-emitting layer 8.

Thus, this embodiment improves a balance of carriers between the electrons and the holes to be injected into the light-emitting layer 8. Hence, in the light-emitting element 2 according to this embodiment, the light-emitting layer 8 shows a decrease in deactivation process because of the Auger recombination and a reduction of the electrons flowing toward the hole-transport layer 10, thereby improving external quantum efficiency.

As illustrated in FIG. 1, in this embodiment, the boundary between the first region 14A and the second region 16A is positioned in the vicinity of, but not limited to, a midpoint of the light-emitting layer 8 along the film thickness. At Step S6 in this embodiment, the time period for impregnation of the second halogen agent is controlled so that the depth of the first region 14A from toward the hole-transport layer 10 can be controlled.

Figure 7:
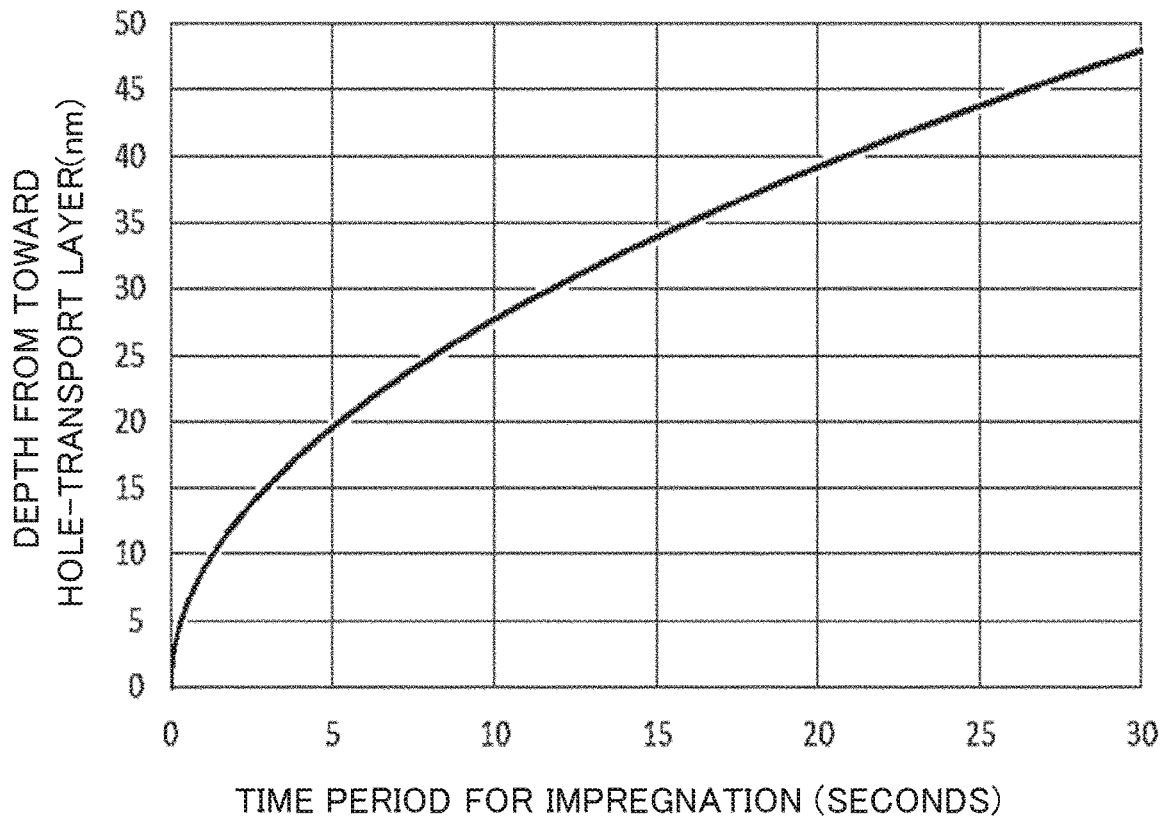
FIG. 7 is a graph illustrating a relationship between a time period for impregnation of a ligand agent into the light-emitting layer and an impregnation distance of the ligand agent in the light-emitting layer according to the first embodiment of the disclosure.

FIG. 7 is a graph illustrating a depth of the first region 14A from toward the hole-transport layer 10 in relation to the time period for the impregnation of the second halogen agent at Step S6. When the concentration of the second halogen agent is constant, FIG. 7 shows that, in accordance with the diffusion equation, the depth of the first region 14A from toward the hole-transport layer 10 increases with the one-half power of the time period for the impregnation of the second halogen agent.

Note that, in FIG. 7, the second halogen agent contains thionyl chloride whose molecules are $10^4$ or more and $10^6$ or fewer per quantum dot. Moreover, FIG. 7 shows that the above second halogen agent as the organic ligands 20 impregnates the second quantum dots 16P to which oleic acid coordinates. Furthermore, in FIG. 7, the second quantum dots 16P impregnated with the second halogen agent have a core/multishell structure of CdSe/ZnS/ZnS, and have a total diameter of 12 nm.

Note that the relationship between the time period for the impregnation of the second halogen agent and the depth of the first region 14A from toward the hole-transport layer 10 depends on such conditions as the kind and concentration of the second halogen agent, the kind of organic ligands coordinated to the second quantum dots 16P, and the structure of the second quantum dots 16P. However, it is unchanging that, in accordance with the diffusion equation, the depth of the first region 14A from toward the hole-transport layer 10 increases with the one-half power of the time period for the impregnation of the second halogen agent.

Figure 8:
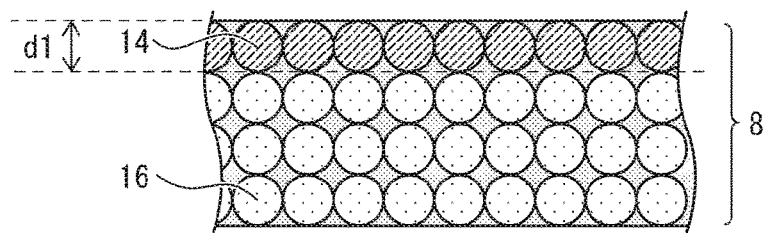
FIG. 8 is a schematic cross-sectional view illustrating a relationship between an impregnation distance of the ligand agent in the light-emitting layer and a condition of quantum dots in the light-emitting layer according to the first embodiment of the disclosure.

Hence, the time period for the impregnation of the second halogen agent is controlled and reduced so that, as illustrated in FIG. 8, only one layer of the first quantum dots 14 may be formed, of the quantum dots contained in the light-emitting layer 8, toward the hole-transport layer 10. In such a case, the first region 14A has a film thickness d1 for one layer of the quantum dots.

Figure 9:
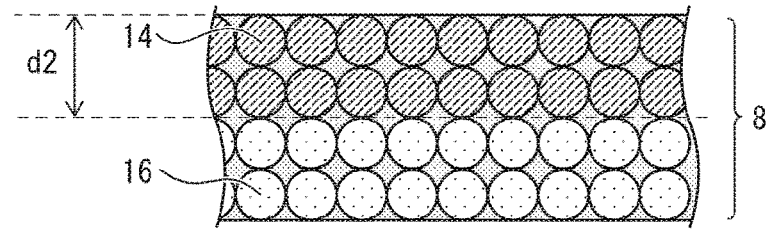
FIG. 9 is another schematic cross-sectional view illustrating a relationship between an impregnation distance of the ligand agent in the light-emitting layer and a condition of quantum dots in the light-emitting layer according to the first embodiment of the disclosure.
Figure 10:
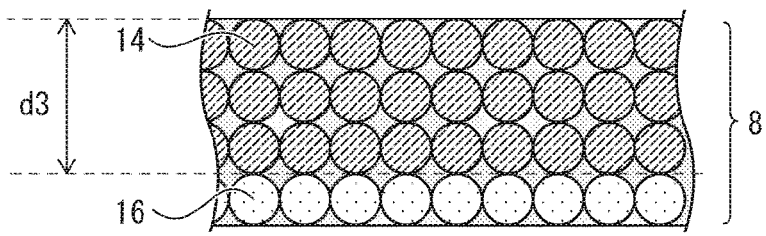
FIG. 10 is still another schematic cross-sectional view illustrating a relationship between an impregnation distance of the ligand agent in the light-emitting layer and a condition of quantum dots in the light-emitting layer according to the first embodiment of the disclosure.

Moreover, the time period for the impregnation of the second halogen agent is controlled and extended so that, as illustrated in FIGS. 9 and 10, the first quantum dots 14 contained in the light-emitting layer 8 may be multilayered. For example, as illustrated in FIG. 9, the first quantum dots 14 are formed only for two layers, so that the first region 14A may have a film thickness d2 for two layers of the quantum dots. Furthermore, as illustrated in FIG. 10, for example, the first quantum dots 14 are formed only for three layers, so that the first region 14A may have a film thickness d3 for three layers of the quantum dots.

The light-emitting device 1 according to this embodiment includes the light-emitting element 2 whose light-emitting layer 8 improves in carrier balance. Hence, in this embodiment, the emission efficiency of the light-emitting device 1 can improve.

Second Embodiment

Figure 11:
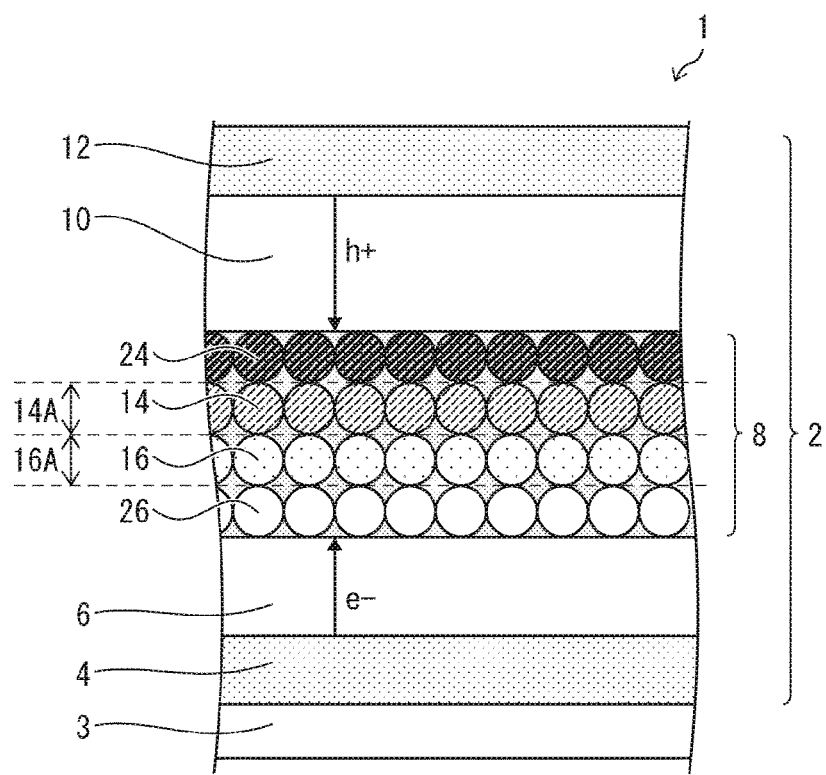
FIG. 11 is a schematic cross-sectional view of the light-emitting device according to a second embodiment of the disclosure.

FIG. 11 is a schematic cross-sectional view of the light-emitting device 1 according to this embodiment. The light-emitting device 1 according to this embodiment is the same in structure as the light-emitting device 1 according to the first embodiment, except for the structure of the light-emitting layer 8. The light-emitting layer 8 according to this embodiment further includes: third quantum dots 24 between the first region 14A and the hole-transport layer 10; and fourth quantum dots 26 between the second region 16A and the electron-transport layer 6.

Figure 12:
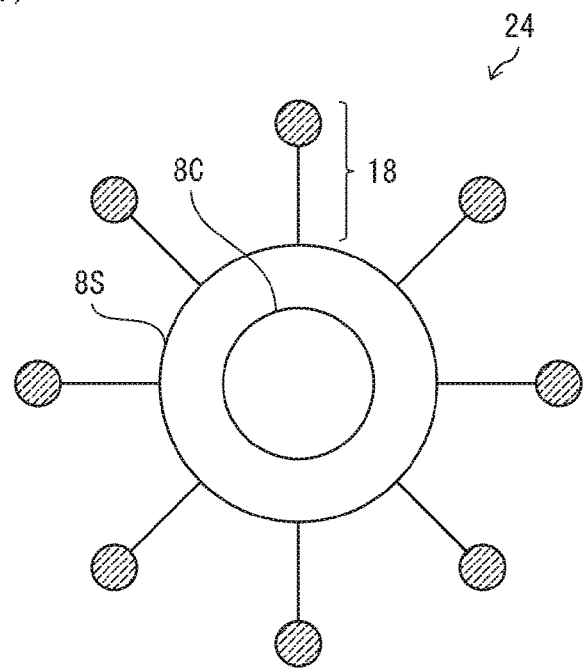
FIG. 12 is an enlarged schematic view of quantum dots according to the second embodiment of the disclosure.
Figure 12:
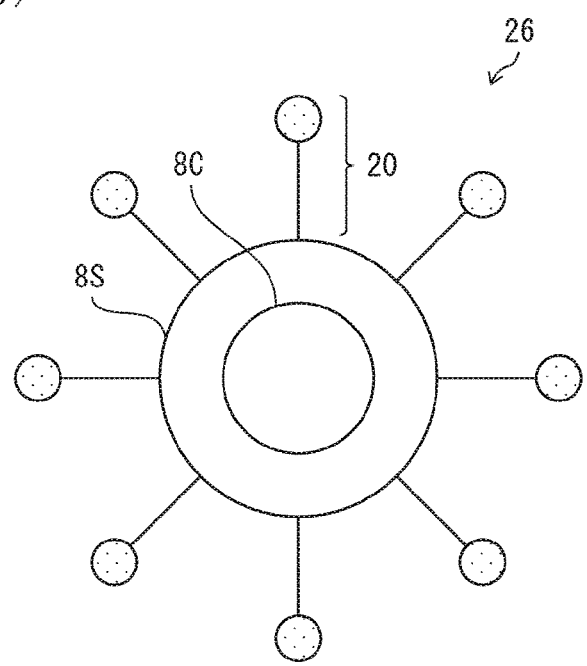

Described below with reference to FIG. 12 are a third quantum dot 24 and a fourth quantum dot 26 included in the light-emitting layer 8 according to this embodiment. FIG. 12(a) illustrates a schematic cross-sectional view of the third quantum dot 24. FIG. 12(b) illustrates a schematic cross-sectional view of the fourth quantum dot 26.

The third quantum dot 24 and the fourth quantum dot 26 may respectively have the same configurations as the first quantum dot 14 and the second quantum dot 16 have, except for the ligands coordinated to the shell 8S. Here, the shell 8S of the third quantum dot 24 has the halogen ligands 18 alone. The shell 8S of the fourth quantum dot 26 has the organic ligands 20 alone.

That is, the light-emitting layer 8 according to this embodiment includes a region containing, as ligands, the halogen ligands 18 alone between the first region 14A and the hole-transport layer 10. In the first region 14A, the halogen ligands 18 are higher in concentration than the organic ligands 20. Moreover, the light-emitting layer 8 according to this embodiment includes a region containing, as ligands, the organic ligands 20 alone between the second region 16A and the electron-transport layer 6. In the second region 16A, the organic ligands 20 are higher in concentration than the halogen ligands 18.

Hence, in the light-emitting layer 8 according to this embodiment, the concentration of the halogen ligands 18 gradually decreases, and the concentration of the organic ligands 20 gradually increases, from toward the hole-transport layer 10 to toward the electron-transport layer 6.

Thus, compared with the light-emitting element 2 according to the first embodiment, the light-emitting element 2 according to this embodiment is further electrically conductive and electron-attracting toward the hole-transport layer 10 of the light-emitting layer 8. Hence, in this embodiment, the mobility of the holes in the light-emitting layer 8 further improves in relation to the mobility of the electrons, and the hole injection barrier further lowers when the holes are injected from the hole-transport layer 10 into the light-emitting layer 8. Hence, in the light-emitting element 2 according to this embodiment, the light-emitting layer 8 further improves in carrier balance.

The light-emitting device 2 according to this embodiment may be produced with the same technique as that for producing the light-emitting device 2 according to the first embodiment, except for the technique for producing the light-emitting layer 8.

Here, in the forming of the light-emitting layer 8 according to this embodiment, the fourth quantum dots 26 may be multilayered at Step S2 described in the first embodiment. Moreover, the light-emitting layer 8 according to this embodiment may be formed, using a diluted halogen agent impregnating the second quantum dots 16P multiple times for different time periods. In this embodiment, Step S4 described in the first embodiment may be omitted.

Hence, the halogen agent does not impregnate, or impregnates only less frequently, the fourth quantum dots 26 positioned deeply away from the hole-transport layer 10. Such a feature makes it possible to either completely prevent halogenation of the organic ligands 20 on the fourth quantum dots 26 positioned deeply away from the hole-transport layer 10, or to halogenate only a small amount of the organic ligands 20.

Likewise, the halogen agent frequently impregnates the third quantum dot 24 positioned close to the hole-transport layer 10. Such a feature makes it possible to either halogenate almost all of the organic ligands 20 on the fourth quantum dots 26 positioned close to the hole-transport layer 10, or to halogenate all of the organic ligands 20.

Third Embodiment

Figure 13:
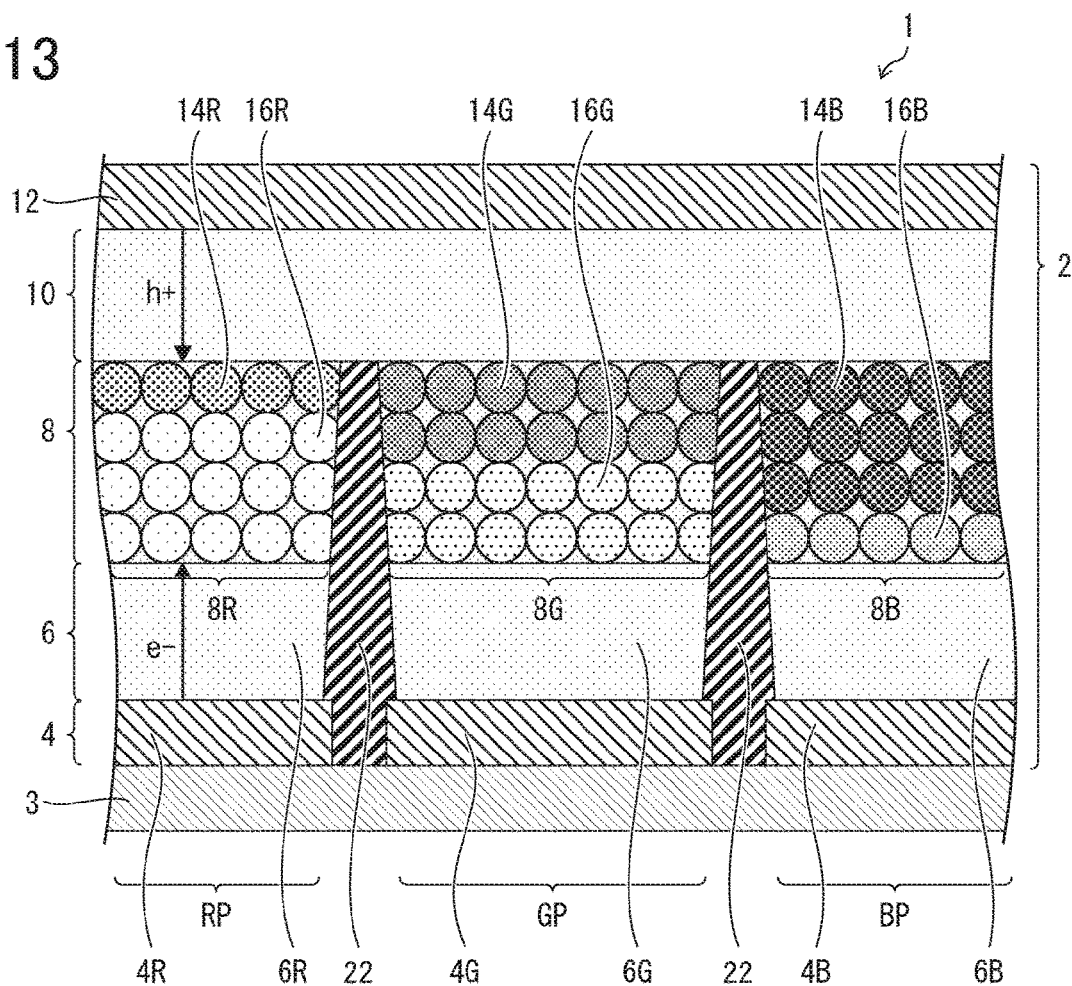
FIG. 13 is a schematic cross-sectional view of the light-emitting device according to a third embodiment of the disclosure.

FIG. 13 is a schematic cross-sectional view of the light-emitting element 2 according to this embodiment. The light-emitting device 1 according to this embodiment is different from the light-emitting element 2 according to the first and second embodiments in that the former includes red sub-pixels RP, green sub-pixels GP, and blue sub-pixels BP.

Similar to the light-emitting element 2 according to the first and second embodiments, the light-emitting element 2 according to this embodiment includes: the cathode 4; the electron-transport layer 6; the light-emitting layer 8; the hole-transport layer 10; and the anode 12 stacked on top of another in the stated order from below. Here, in this embodiment, the cathode 4, the electron-transport layer 6, and the light-emitting layer 8 are divided with edge covers 22.

In particular, in this embodiment, the cathode 4, is divided with the edge covers 22 into a cathode 4R, a cathode 4G, and a cathode 4B. Moreover, the electron-transport layer 6 is divided with the edge covers 22 into an electron-transport layer 6R, an electron-transport layer 6G, and an electron-transport layer 6B. Furthermore, the light-emitting layer 8 is divided with the edge covers 22 into a red light-emitting layer 8R, a green light-emitting layer 8G, and a blue light-emitting layer 8B. Note that the hole-transport layer 10 and the anode 12 are not divided with the edge covers 22, but are formed in common. As illustrated in FIG. 13, the edge covers 22 may be positioned to cover side faces and circumferential edges of top faces of the cathode 4.

Moreover, in the light-emitting element 2 according to this embodiment, each of the red sub-pixels RP includes: the cathode 4R, the electron-transport layer 6R, and the red light-emitting layer 8R shaped into an island; and the hole-transport layer 10 and the anode 12 formed in common. Likewise, each of the green sub-pixels GP includes: the cathode 4G, the electron-transport layer 6G, and the green light-emitting layer 8G shaped into an island; and the hole-transport layer 10 and the anode 12 formed in common. Likewise, each of the blue sub-pixels BP includes: the cathode 4B, the electron-transport layer 6B, and the blue light-emitting layer 8B shaped into an island; and the hole-transport layer 10 and the anode 12 formed in common.

In this embodiment, the red light-emitting layer 8R included in the red sub-pixel RP emits red light, the green light-emitting layer 8G included in the green sub-pixel GP emits green light, and the blue light-emitting layer 8B included in the blue sub-pixel BP emits blue light. Specifically, the light-emitting element 2 includes a plurality of sub-pixels for each of the wavelengths of light emitted from the light-emitting layer 8. Each of the sub-pixels includes the cathode 4, the electron-transport layer 6, and the light-emitting layer 8. Note that the light-emitting element 2 includes the hole-transport layer 10 and the anode 12 in common among all the sub-pixels.

Here, the blue light has a center wavelength in a wavelength band ranging, for example, from 400 nm to 500 nm. The green light has a center wavelength in a wavelength band of, for example, longer than 500 nm and 600 nm or shorter. The red light has a center wavelength in a wavelength band of, for example, longer than 600 nm and 780 nm or shorter.

In the light-emitting element 2 according to this embodiment, a group including one each of the red sub-pixels RP, the green sub-pixels GP, and the blue sub-pixels BP may serve as one pixel of the light-emitting element 2. Moreover, FIG. 13 illustrates only one pixel. Alternatively, in this embodiment, the light-emitting element 2 may include a plurality of pixels.

Except for the light-emitting layer 8, the layers of the light-emitting element 2 according to this embodiment may be formed of the same materials as those of the layers of the light-emitting element 2 according to the first and second embodiments. Here, the red light-emitting layer 8R according to this embodiment includes: first red quantum dots 14R; and second red quantum dots 16R. Likewise, the green light-emitting layer 8G includes: first green quantum dots 14G; and second green quantum dots 16G. Moreover, the blue light-emitting layer 8B includes: first blue quantum dots 14B; and second blue quantum dots 16B.

The first red quantum dots 14R and the second red quantum dots 16R emit red light. The first green quantum dots 14G and the second green quantum dots 16G emit green light. The first blue quantum dots 14B and the second blue quantum dots 16B emit blue light.

Except for the above features, the first red quantum dots 14R, the first green quantum dots 14G, and the first blue quantum dots 14B are the same in configuration as the first quantum dots 14 described above. Likewise, the second red quantum dots 16R, the second green quantum dots 16G, and the second blue quantum dots 16B are the same in configuration as the second quantum dots 16 described above.

The colors of the light emitted from the quantum dots contained in the light-emitting layer 8 according to this embodiment may be created by controlling particle sizes of the cores of the quantum dots. Moreover, the particle sizes of the quantum dots may be regulated to have substantially equal thickness by appropriately adjusting film thickness of the shells.

Figure 14:
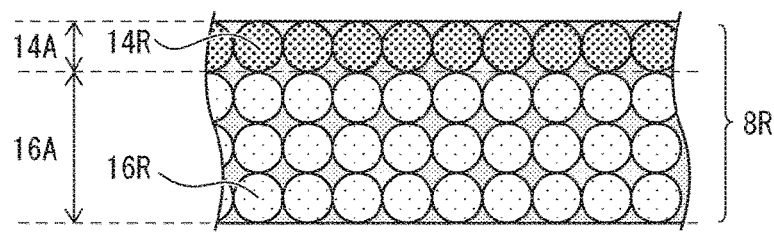
FIG. 14 is an enlarged schematic view of a red light-emitting layer according to the third embodiment of the disclosure.
Figure 15:
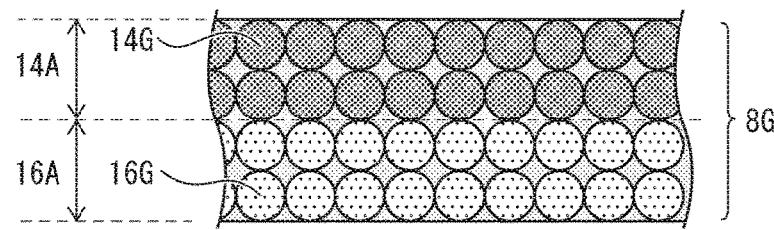
FIG. 15 is an enlarged schematic view of a green light-emitting layer according to the third embodiment of the disclosure.
Figure 16:
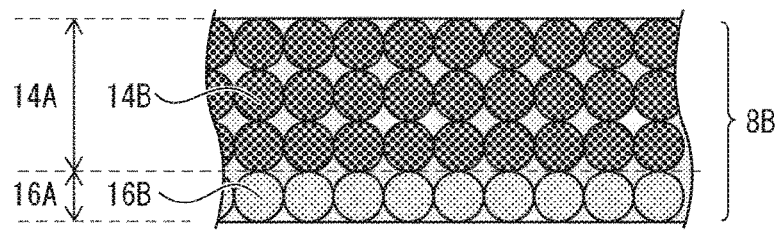
FIG. 16 is an enlarged schematic view of a blue light-emitting layer according to the third embodiment of the disclosure.

FIGS. 14, 15, and 16 respectively show schematic cross-sectional views of the red light-emitting layer 8R, the green light-emitting layer 8G, and the blue light-emitting layer 8B according to this embodiment. As illustrated in FIGS. 14, 15, and 16, each of the red light-emitting layer 8R, the green light-emitting layer 8G, and the blue light-emitting layer 8B includes: the first region 14A toward the hole-transport layer 10; and the second region 16A toward the electron-transport layer 6, as seen in the light-emitting layer 8 according to the first and second embodiments described above.

In the red light-emitting layer 8R, the first region 14A includes the first red quantum dots 14R and the second region 16A includes the second red quantum dots 16R. Moreover, in the green light-emitting layer 8G, the first region 14A includes the first green quantum dots 14G, and the second region 16A includes the second green quantum dots 16G. Furthermore, in the blue light-emitting layer 8B, the first region 14A includes the first blue quantum dots 14B, and the second region 16A includes the second blue quantum dots 16B.

Hence, as seen in the light-emitting layer 8 according to the first and second embodiments described above, the light-emitting layer 8 according to this embodiment includes the first region 14A in which the concentration of the halogen ligands 18 is higher toward the hole-transport layer 10 than the concentration of the organic ligands 20. Likewise, as seen in the light-emitting layer 8 according to the first and second embodiments described above, the light-emitting layer 8 according to this embodiment includes the second region 16A in which the concentration of the organic ligands 20 are higher toward the electron-transport layer 6 than the concentration of the halogen ligands 18.

Here, in this embodiment, the first region 14A and the second region 16A have different thicknesses among the red light-emitting layer 8R, the green light-emitting layer 8G, and the blue light-emitting layer 8B. In particular, the first region 14A in the green light-emitting layer 8G is thicker than the first region 14A in the red light-emitting layer 8R, and is thinner than the first region 14A in the blue light-emitting layer 8B.

Moreover, in this embodiment, in the thickness direction of the light-emitting layer 8, a proportion of the first region 14A in the green light-emitting layer 8G is larger than a proportion of the first region 14A in the red light-emitting layer 8R, and the proportion of the first region 14A in the green light-emitting layer 8G is smaller than a proportion of the first region 14A in the blue light-emitting layer 8B. Here, in the thickness direction of the light-emitting layer 8, the proportion of the first region 14A is equal to a value obtained by dividing the thickness of the first region 14A by the total film thickness of the light-emitting layer 8.

Note that, as to the thickness of the light-emitting layer 8, the red light-emitting layer 8R, the green light-emitting layer 8G, and the blue light-emitting layer 8B may be the same or different in thickness. If the red light-emitting layer 8R, the green light-emitting layer 8G, and the blue light-emitting layer 8B have the same thickness, the relationship of difference in thickness of the first regions 14A of the light-emitting layers 8R, 8G, and 8B coincides with the relationship of difference in proportion of the first regions 14A in the thickness direction of the light-emitting layer 8.

In this embodiment, a thickness of the first region 14A in the red light-emitting layer 8R is greater than or equal to one-fifth of, and smaller than or equal to one-third of, a thickness of the red light-emitting layer 8R. In this embodiment, a thickness of the first region 14A in the green light-emitting layer 8G is greater than or equal to one-fourth of, and smaller than or equal to three-fourth of, a thickness of the green light-emitting layer 8G. In this embodiment, a thickness of the first region 14A in the blue light-emitting layer 8B is greater than or equal to one-half of, and smaller than or equal to four-fifth of, a thickness of the blue light-emitting layer 8B.

The light-emitting device 2 according to this embodiment may be produced with the same technique as that for producing the light-emitting device 2 according to the first and second embodiments, except for the technique for producing the light-emitting layer 8. The light-emitting layer 8 according to this embodiment may be formed by repeatedly carrying out Step S2 to Step S8 in FIG. 3 for each color of the light to be emitted from the light-emitting layer 8.

At Step S2 according to this embodiment, a material formed of photosensitive resin is applied to the electron-transport layer 6. Dispersed in the photosensitive resin are the organic ligand quantum dots 16N having corresponding colors of light. Next, the applied material is exposed to light, using a photomask. Hence, the organic ligand quantum dots 16N may be patterned. As can be seen, at Step S2, the organic ligand quantum dots 16N having the corresponding colors of light can be multilayered above the respective cathodes 4.

Next Step S4 is executed. The second quantum dots 16P for each color are formed of the organic ligand quantum dots 16N having the corresponding colors of light.

At Step S6 according to this embodiment, the time period for the impregnation of the quantum dots with the second halogen agent varies for each of the light-emitting layers. In particular, in this embodiment, a time period for the impregnation of the second quantum dots 16P, which emit green light, with the second halogen agent is longer than a time period for the impregnation of the second quantum dots 16P, which emit red light, with the second halogen agent. Moreover, a time period for the impregnation of the second quantum dots 16P, which emit green light, with the second halogen agent is longer than a time period for the impregnation of the second quantum dots 16P, which emit blue light, with the second halogen agent.

Here, the second quantum dots 16P each have a particle size of 12 nm, and are stacked into four layers for each of the colors. Each of the second quantum dots has a core/multishell structure of CdSe/ZnS/ZnS. To each second quantum dot, oleic acid is coordinated as the organic ligands 20. Furthermore, the second halogen agent contains thionyl chloride whose molecules are $10^4$ or more and $10^6$ or fewer per quantum dot.

In such a case, a time period is set to, for example, two seconds for the impregnation of the second quantum dots 16P, which emit red light, with the second halogen agent. Such a feature makes it possible to reform just one layer, from the hole-transport layer 10, of the red-light-emitting second quantum dots 16P into pre-heated first quantum dots 14P that emit red light.

Moreover, for example, a time period is set to eight seconds for the impregnation of the second quantum dots 16I, which emit green light, with the second halogen agent. Such a feature makes it possible to reform just two layers, from the hole-transport layer 10, of the green-light-emitting second quantum dots 16P into pre-heated first quantum dots 14P that emit green light.

Furthermore, for example, a time period is set to 17 seconds for the impregnation of the second quantum dots 16P, which emit blue light, with the second halogen agent. Such a feature makes it possible to reform just three layers, from the hole-transport layer 10, of the blue-light-emitting second quantum dots 16P into pre-heated first quantum dots 14P that emit blue light.

Note that Step S8 according to this embodiment may be carried out with the same technique described in the above first and second embodiments. Moreover, Step S8 may be carried out every time Step S6 finishes working on a light-emitting layer for one color of the light. Step S8 may also be collectively carried out when Step S6 finishes working on all the light-emitting layers. Hence, the light-emitting layer 8 in FIG. 13 can be formed.

Note that if Step S8 is collectively carried out after Step S6 finishes working on all the light-emitting layers, Step S6 may repeat impregnation of the second quantum dots 16P with the second halogen agent and rinse of the second quantum dots 16P. Meanwhile, at Step S6, the impregnation of the second quantum dots 16P for each color with the second halogen agent may end substantially simultaneously.

Specifically, at Step S6, first, blue-light-emitting second quantum dots 16P start to be impregnated with the second halogen agent. Moreover, in nine seconds from the start of the impregnation of the blue-light-emitting second quantum dots 16P with the second halogen agent, green-light-emitting second quantum dots 16P start to be impregnated with the second halogen agent. In addition, in six seconds from the start of the impregnation of the green-light-emitting second quantum dots 16P with the second halogen agent, red-light-emitting second quantum dots 16P start to be impregnated with the second halogen agent.

Thanks to such a technique, at Step S6, the impregnation of the second quantum dots 16P for each color with the second halogen agent ends substantially simultaneously. Hence, the second quantum dots 16P for each color can be simultaneously rinsed.

In the light-emitting element 2 according to this embodiment, the light-emitting layer 8 includes: the red light-emitting layer 8R including quantum dots emitting red light; the green light-emitting layer 8G including quantum dots emitting green light; and the blue light-emitting layer 8B including quantum dots emitting blue light. Typically, the bandgap of quantum dots is larger as a wavelength of light obtained from the quantum dots is shorter. Hence, the bandgaps of the red light-emitting layer 8R, the green light-emitting layer 8G, and the blue light-emitting layer 8B are larger in the stated order.

Moreover, in this embodiment, the hole-transport layer 10 is formed in common among the sub-pixels. Hence, when the holes are injected from the hole-transport layer 10, the hole injection barriers of the red light-emitting layer 8R, the green light-emitting layer 8G, and the blue light-emitting layer 8B are larger in the stated order.

In this embodiment, the first regions 14A in the red light-emitting layer 8R, the green light-emitting layer 8G, and the blue light-emitting layer 8B are thicker in the stated order. Hence, the variations in valence band level of the red light-emitting layer 8R, the green light-emitting layer 8G, and the blue light-emitting layer 8B by the halogen ligands 18 are larger in the stated order.

Hence, in this embodiment, when the holes are injected from the hole-transport layer 10 into the light-emitting layer 8, the hole injection barriers are optimized among the sub-pixels. Thus, this embodiment can improve a balance of the carriers in the light-emitting layer 8 among the sub-pixels, and provide the light-emitting device 1 with higher display quality.

Fourth Embodiment

Figure 17:
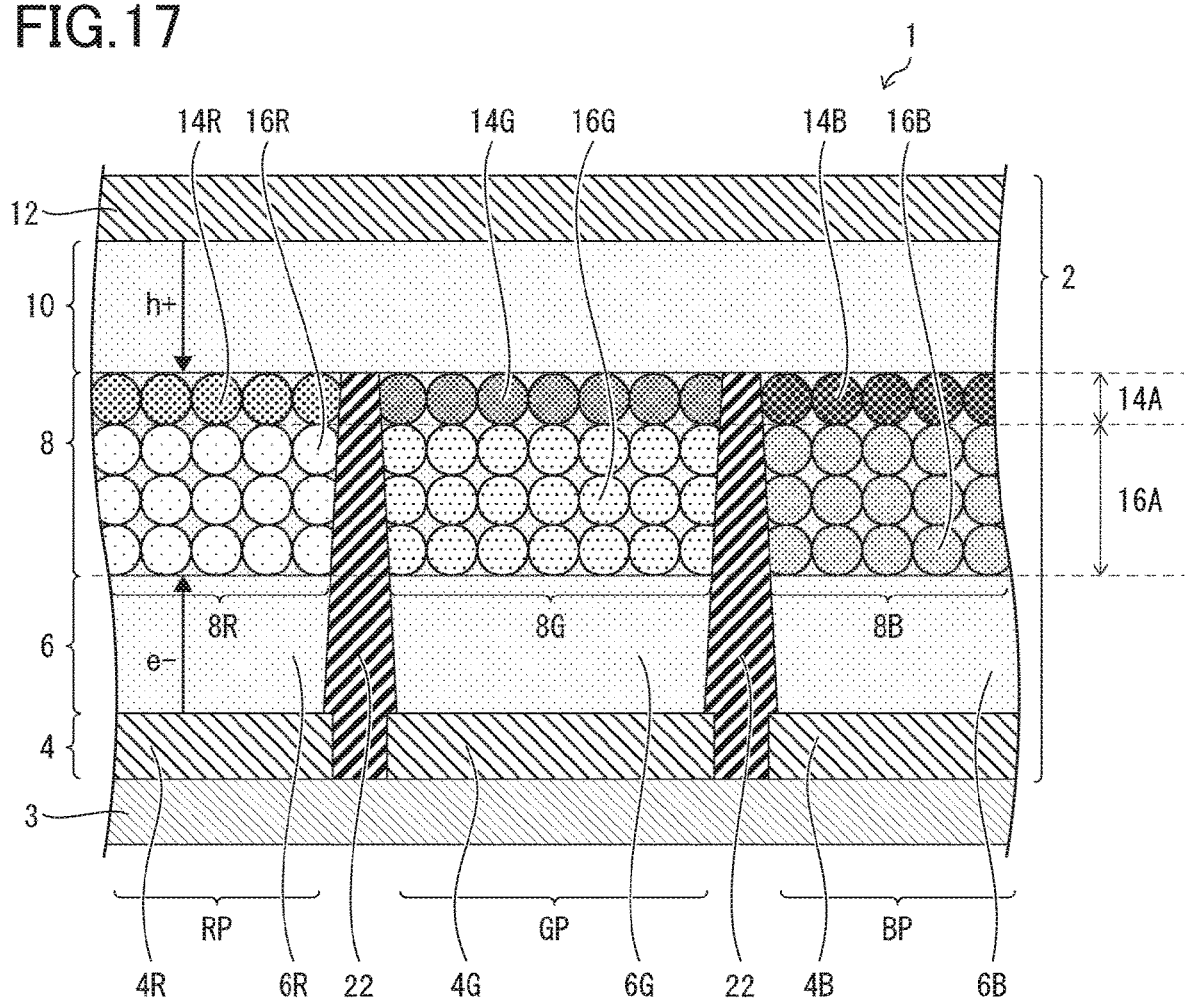
FIG. 17 is a schematic cross-sectional view of the light-emitting device according to a fourth embodiment of the disclosure.

FIG. 17 is a schematic cross-sectional view of the light-emitting device 1 according to this embodiment. The light-emitting device 1 according to this embodiment is the same in structure as the light-emitting element 2 according to the first to third embodiments, except for the structure of the light-emitting layer 8.

In this embodiment, the concentrations of the halogen ligands 18 in the first regions 14A of the red light-emitting layer 8R, the green light-emitting layer 8G, and the blue light-emitting layer 8B are higher in the stated order. In particular, in this embodiment, the quantities of the halogen ligands 18 in the first regions 14A of the red light-emitting layer 8R, the green light-emitting layer 8G, and the blue light-emitting layer 8B are larger in the stated order.

In this embodiment, the thicknesses of the first regions 14A in the red light-emitting layer 8R, the green light-emitting layer 8G, and the blue light-emitting layer 8B in relation to the thicknesses of the respective light-emitting layers are the same in proportion. That is, in this embodiment, when the thicknesses of the light-emitting layer 8 are the same among the sub-pixels, the first regions 14A in the red light-emitting layer 8R, the green light-emitting layer 8G, and the blue light-emitting layer 8B have substantially the same thickness.

Figure 18:
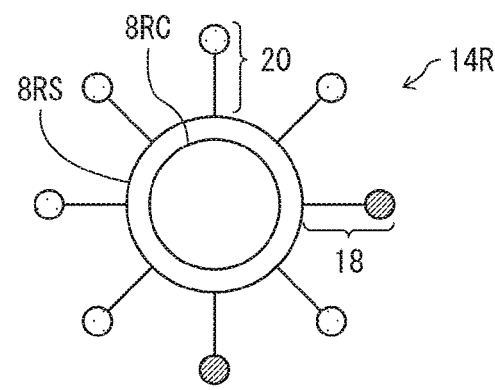
FIG. 18 is a schematic enlarged view of quantum dots according to the fourth embodiment of the disclosure.
Figure 18:
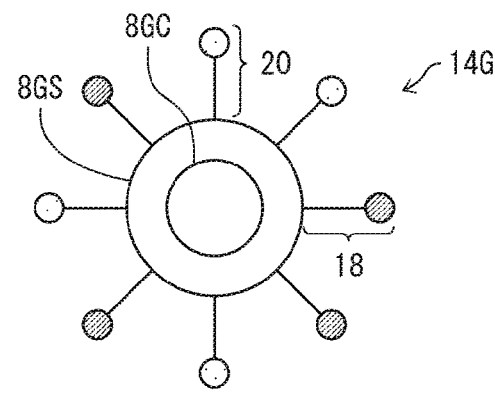
Figure 18:
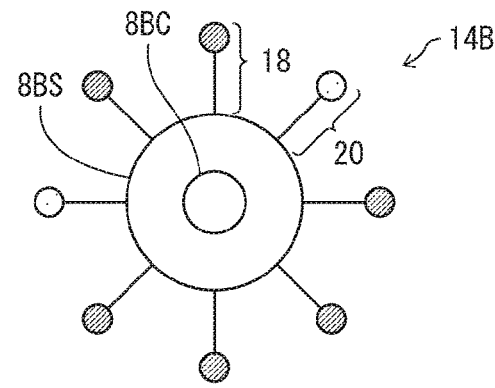

Described below with reference to FIG. 18 are the first red quantum dots 14R, the first green quantum dots 14G, and the first blue quantum dots 14B included in the light-emitting layer 8 according to this embodiment. FIG. 18(a) illustrates a schematic cross-sectional view of a first red quantum dot 14R. FIG. 18(b) illustrates a schematic cross-sectional view of a first green quantum dot 14G. FIG. 18(c) illustrates a schematic cross-sectional view of a first blue quantum dot 14B.

As illustrated in FIG. 18(a), the first red quantum dot 14R includes: a core 8RC; and a shell 8RS. Moreover, as illustrated in FIG. 18(b), the first green quantum dot 14G includes: a core 8GC; and a shell 8GS. Furthermore, as illustrated in FIG. 18(c), the first blue quantum dot 14B includes: a core 8BC; and a shell 8BS. The cores and shells of the quantum dots may be formed of the same materials as those of the cores and shells according to the first to third embodiments described above.

In this embodiment, the core 8GC is smaller in particle size than the core 8RC, and larger in particle size than the core 8BC. Hence, the wavelengths of light emitted from the first red quantum dot 14R, the first green quantum dot 14G, and the first blue quantum dot 14B are shorter in the stated order.

Note that, in this embodiment, the film thicknesses of the shell 8BS, the shell 8GS, and the shell 8RS may be thinner in the stated order in conformity with the variation in the particle sizes of the core 8RC, the core 8CC, and the core 8BC. Hence, as illustrated in FIG. 18, the particle sizes of the first red quantum dot 14R, the first green quantum dot 14G, and the first blue quantum dot 14B may be substantially the same.

In this embodiment, as illustrated in FIG. 18, the quantity of the halogen ligands 18 coordinated to one shell 8GS is larger than the quantity of the halogen ligands 18 coordinated to one shell 8RS, and is smaller than the quantity of the halogen ligands 18 coordinated to one shell 8BS. Hence, the quantities of the halogen ligands 18 that the first red quantum dot 14R, the first green quantum dot 14G, and the first blue quantum dot 14B have are larger in the stated order.

For example, the first regions 14A of the red light-emitting layer 8R, the green light-emitting layer 8G, and the blue light-emitting layer 8B may contain the same quantity of the first red quantum dots 14R, the first green quantum dots 14G, and the first blue quantum dots 14B illustrated in FIG. 18. Such a feature makes it possible to readily form the light-emitting layer 8 in which the concentrations of the halogen ligands 18 in the first regions 14A of the red light-emitting layer 8R, the green light-emitting layer 8G, and the blue light-emitting layer 8B are higher in the stated order.

Note that, in this embodiment, the proportion of the thicknesses of the first regions 14A in the red light-emitting layer 8R, the green light-emitting layer 8G, and the blue light-emitting layer 8B to the thicknesses of the respective light-emitting layers is preferably greater than or equal to one-fifth and smaller than or equal to one-half.

The light-emitting device 2 according to this embodiment may be produced with the same technique as that for producing the light-emitting device 2 according to the first to third embodiments, except for Step S6 for producing the light-emitting layer 8. At Step S6 according to this embodiment, the number of times for the impregnation of the quantum dots with the second halogen agent varies for each of the light-emitting layers.

In particular, in this embodiment, the number of times for the impregnation of green-light-emitting second quantum dots 16P with the second halogen agent is larger than the number of times for the impregnation of red-light-emitting-second quantum dots 16P with the second halogen agent. Moreover, the number of times for the impregnation of the green-light-emitting-second quantum dots 16P with the second halogen agent is smaller than the number of times for the impregnation of blue-light-emitting second quantum dots 16P with the second halogen agent.

Note that, also at Step S6 in this embodiment, the time periods for the impregnation of the red-light-emitting second quantum dots 16P, the green-light-emitting second quantum dots 16P, and the blue-light-emitting second quantum dots 16P with the second halogen agent may be longer in the stated order.

Specifically, for example, at Step S6, the red-light-emitting second quantum dots 16P may be impregnated with the second halogen agent only once for two seconds. Moreover, for example, the green-light-emitting second quantum dots 16P may be impregnated with the second halogen agent only twice for four seconds each. Furthermore, for example, the blue-light-emitting second quantum dots 16P may be impregnated with the second halogen agent only three times for five seconds each.

In this embodiment, the concentrations of the halogen ligands 18 in the first regions 14A of the red light-emitting layer 8R, the green light-emitting layer 8G, and the blue light-emitting layer 8B are higher in the stated order. As seen in the first to third embodiments, also in this case, the variations in valence band level of the red light-emitting layer 8R, the green light-emitting layer 8G, and the blue light-emitting layer 8B by the halogen ligands 18 are larger in the stated order. Hence, the light-emitting device 2 according to this embodiment has the same advantageous effects as those of the light-emitting device 2 according to the first to third embodiments.

The disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the disclosure. Moreover, the technical aspects disclosed in each embodiment may be combined to achieve a new technical feature.

The invention claimed is:

1. A light-emitting element comprising:
a cathode; an anode; a light-emitting layer provided between the cathode and the anode and containing quantum dots; an electron-transport layer provided between the light-emitting layer and the cathode; and a hole-transport layer provided between the light-emitting layer and the anode,
the light-emitting layer containing halogen ligands and organic ligands coordinated to each of the quantum dots,
the light-emitting layer including: a first region toward the hole-transport layer; and a second region toward the electron-transport layer, and
in the first region, a concentration of the halogen ligands being higher than a concentration of the organic ligands, and, in the second region, the concentration of the halogen ligands being lower than the concentration of the organic ligands.

2. The light-emitting element according to claim 1, wherein
the halogen ligands contain halogens selected from among at least one or more of F, Cl, Br and I.

3. The light-emitting element according to claim 1, wherein
of ligands coordinated to the quantum dots contained in the first region, a proportion of the halogen ligands is higher than a proportion of the organic ligands.

4. The light-emitting element according to claim 1, wherein
of ligands coordinated to the quantum dots contained in the second region, a proportion of the organic ligands is higher than a proportion of the halogen ligands.

5. The light-emitting element according to claim 1, wherein
the light-emitting layer contains quantum dots provided between the hole-transport layer and the first region, and having the halogen ligands alone.

6. The light-emitting element according to claim 1, wherein
the light-emitting layer contains quantum dots provided between the electron-transport layer and the second region, and having the organic ligands alone.

7. The light-emitting element according to claim 1, wherein the organic ligands contained in the first region are smaller in quantity than the organic ligands contained in the second region.

8. The light-emitting element according to claim 1, wherein
in the light-emitting layer, a concentration of halogens gradually decreases from toward the hole-transport layer to toward the electron-transport layer.

9. The light-emitting element according to claim 1, wherein
the light-emitting layer includes: a red light-emitting layer; and a green light-emitting layer, and
in a thickness direction of the light-emitting layer, a proportion of the first region in the green light-emitting layer is larger than a proportion of the first region in the red light-emitting layer.

10. The light-emitting element according to claim 9, wherein
the first region in the green light-emitting layer is thicker than the first region in the red light-emitting layer.

11. The light-emitting element according to claim 9, wherein
the light-emitting layer further includes a blue light-emitting layer, and
in the thickness direction of the light-emitting layer, the proportion of the first region in the green light-emitting layer is smaller than a proportion of the first region in the blue light-emitting layer.

12. The light-emitting element according to claim 11, wherein
the first region in the blue light-emitting layer is thicker than the first region in the red light-emitting layer.

13. The light-emitting element according to claim 11, wherein
the first region in the blue light-emitting layer is thicker than the first region in the green light-emitting layer.

14. The light-emitting element according to claim 9, wherein
a thickness of the first region in the red light-emitting layer is greater than or equal to one-fifth of, and smaller than or equal to one-third of, a thickness of the red light-emitting layer.

15. The light-emitting element according to claim 9, wherein
a thickness of the first region in the green light-emitting layer is greater than or equal to one-fourth of, and smaller than or equal to three-fourth of, a thickness of the green light-emitting layer.

16. The light-emitting element according to claim 11, wherein
a thickness of the first region in the blue light-emitting layer is greater than or equal to one-half of, and smaller than or equal to four-fifth of, a thickness of the blue light-emitting layer.

17. The light-emitting element according to claim 1, wherein
the light-emitting layer includes: a red light-emitting layer; and a green light-emitting layer, and
a proportion of a thickness of the first region in the red light-emitting layer to a thickness of the red light-emitting layer is equal to a proportion of a thickness of the first region in the green light-emitting layer to a thickness of the green light-emitting layer, and the thicknesses of the first regions in the red light-emitting layer and in the green light-emitting layer are greater than or equal to one-fifth of, and smaller than or equal to one-half of, the thicknesses of the red light-emitting layer and the green light-emitting layer, and
the concentration of the halogen ligands in the first region of the green light-emitting layer is higher than the concentration of the halogen ligands in the first region of the red light-emitting layer.

18. The light-emitting element according to claim 17, wherein
the light-emitting layer further includes a blue light-emitting layer, and
a proportion of the thickness of the first region in the green light-emitting layer to the thickness of the green light-emitting layer is equal to a proportion of a thickness of the first region in the blue light-emitting layer to a thickness of the blue light-emitting layer, and the thicknesses of the first regions in the green light-emitting layer and in the blue light-emitting layer are greater than or equal to one-fifth of, and smaller than or equal to one-half of, the thicknesses of the green light-emitting layer and the blue light-emitting layer, and
the concentration of the halogen ligands in the first region of the blue light-emitting layer is higher than the concentration of the halogen ligands in the first region of the green light-emitting layer.

19. A light-emitting device including at least one light-emitting element according to claim 1.

20. A method for manufacturing a light-emitting element including: a cathode; an anode; a light-emitting layer provided between the cathode and the anode and containing quantum dots; an electron-transport layer provided between the light-emitting layer and the cathode; and a hole-transport layer provided between the light-emitting layer and the anode, the method comprising
forming the light-emitting layer above the electron-transport layer,
the forming of the light-emitting layer including:
stacking the light-emitting layer above the electron-transport layer, the light-emitting layer containing the quantum dots having organic ligands;
impregnating a surface of the light-emitting layer with a halogen agent toward the electron-transport layer; and
heating the light-emitting layer after the impregnating.

* * * * *